United States Patent [19]

Sumi et al.

[11] Patent Number: 5,119,092
[45] Date of Patent: Jun. 2, 1992

[54] APPARATUS FOR ENCODING, DECODING, AND STORING WAVEFORMS

[75] Inventors: Kazuyuki Sumi, Nara; Atsunori Kitoh, Yamatotakada, both of Japan

[73] Assignee: Sharp Kabushiki Kaisha, Osaka, Japan

[21] Appl. No.: 438,869

[22] Filed: Nov. 20, 1989

[30] Foreign Application Priority Data

Nov. 22, 1988 [JP] Japan .................................. 63-294967
Dec. 28, 1988 [JP] Japan .................................. 63-331743

[51] Int. Cl.[5] .......................... H03M 7/00; G10L 9/18
[52] U.S. Cl. ........................................ 341/60; 341/63; 341/67
[58] Field of Search ........................ 341/50, 51, 60, 67, 341/76, 77, 100, 101, 63, 164; 364/200, 900

[56] References Cited

U.S. PATENT DOCUMENTS 4,040,024 8/1977 Cowe et al. ........................ 364/900
4,376,933 3/1983 Saran et al. ........................ 341/67
4,593,267 6/1986 Kuroda et al. ........................ 341/67
4,914,675 4/1990 Fedele ........................ 341/67 X Primary Examiner—Howard L. Williams
Attorney, Agent, or Firm—Sandler, Greenblum & Bernstein

[57] ABSTRACT

A waveform encoding and decoding apparatus is disclosed which comprises a memory, a coding device, a packing unit, and a storage device. The coding device encodes an analog waveform into digital coded data having digital coded data words each having a predetermined length. The packing device "packs" groups of more than one of the coded data words into packed data words each having a predetermined length. The storage device stores the packed data words into respective segments located in the memory. The segments which are located in the memory each have a bit length equal to the predetermined length of the packed data words. A data transfer device may also be provided for transferring and rearranging data between segments located in the memory.

10 Claims, 9 Drawing Sheets

APPARATUS FOR ENCODING, DECODING, AND STORING WAVEFORMS

BACKGROUND OF THE INVENTION

1. Field of the Invention

The present invention relates to a voice (i.e. sound) recording and reproducing apparatus which is adapted to memorize digitally coded data formed by coding voice waveforms, and also to reproduce synthesized voice waveforms by reading and decoding the memorized coded data.

2. Description of the Prior Art

Figure 1:
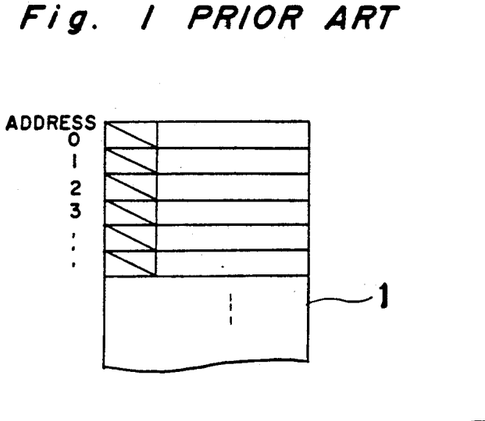
FIG. 1 is a diagram showing the structure of a memory having coded data written therein according to the prior art.

Generally, referring to FIG. 1, a memory element 1 has a plurality of data storing segments which are given with address numbers. If the bit length of each data storing segment (maximum word length) is not equal to the bit length of the coded data of the voice, the coded data is stored in the memory segment in the following manner.

As shown in FIG. 1, one word of coded data is stored in one memory segment of a memory element 1 with the right end of the stored data word being aligned at the right end of its respective memory segment. Thus, there will be a non-used space (indicated by a back-slash) in each segment. In this manner, a plurality of data areas A, B and C, each comprising a string of coded data words, are formed in the memory element 1 as shown in FIG. 2(a).

Figure 2A:
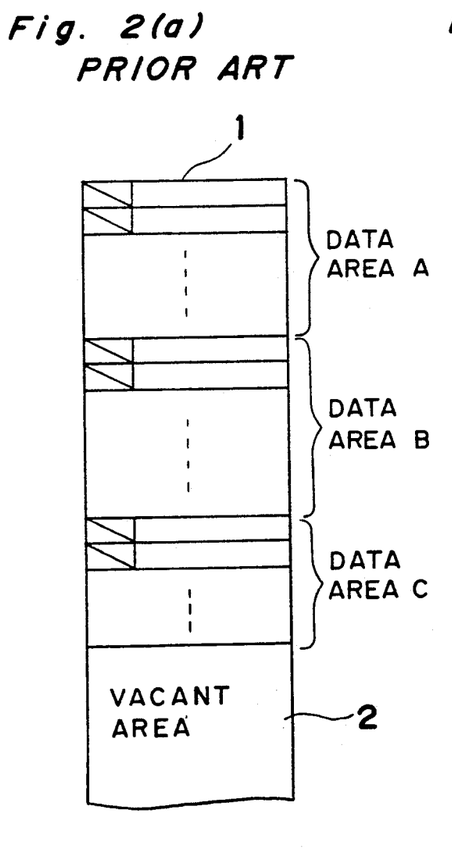
FIGS. 2(a) and 2(b) are diagrams showing the change of the memory of FIG. 1 before and after a data transfer within the memory.
Figure 2B:
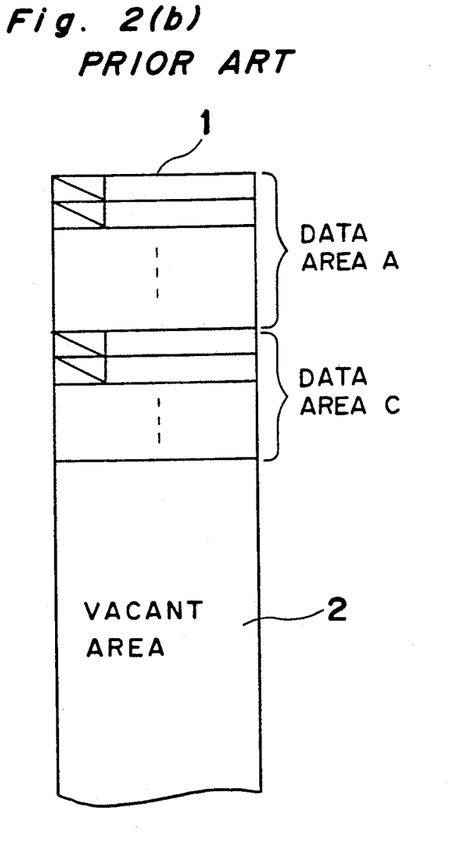

If the data in the data area B (FIG. 2(a)) of coded data of voice is erased, data area C is shifted next to data area A, thus causing a vacant area 2 which has formed in the memory element 1, to be enlarged as shown in FIG. 2(b). Accordingly, this increased vacant area in the memory element 1 is ready for use in the next recording. As is understood from FIG. 2(b), the vacant area 2 is formed by shifting coded data in the data area C towards the front end of the memory by the control of, e.g., a CPU (central processing unit). Such a data shift will be referred to as a data transfer within the memory.

In the above-described prior art arrangement, however, if the maximum word length acceptable to each memory segment in the memory element is longer than the word length of entered coded data words, the area indicated by the back-slash in FIG. 2(a) will not be used, thus, wasting the memory area.

Moreover, since the non-used memory areas are shifted without any change during the data transfer within the memory, the memory element 1 includes the non-used memory area even after the data transfer as shown in FIG. 2(b).

SUMMARY OF THE INVENTION

An essential object of the present invention is to provide a voice recording and reproducing apparatus wherein coded data can be effectively memorized within a memory element even when the maximum word length acceptable in each memory segment of the memory element is not equal to the word length of coded data words. At the same time, vacant areas can be formed in a consecutive series without generating any non-used areas within the data stored area even after the data transfer.

In accomplishing the above object, according to the present invention, the voice recording and reproducing apparatus is provided with coding/decoding means which encodes inputted data representative of voice waveforms to thereby to form digital coded data, and decodes the digital coded data into data representing synthesized voice waveforms. Packing means is also provided in the voice recording and reproducing apparatus which, during recording of a voice waveform, packs the coded data into memory to thereby form memory data, and writes the memory data in a write-in address located in the memory. During playback of a voice waveform, the packing means returns the memory data read out from a read-in address in the packed state into the coded data of decoding time. The voice recording and reproducing apparatus further includes a memory data transfer means which successively reads out the memory data in the packed state from the read-in address, and at the same time, successively writes the memory data into the write-in address on the memory.

BRIEF DESCRIPTION OF THE DRAWINGS

This and other objects and features of the present invention will become apparent from the following description taken in conjunction with preferred embodiments thereof, with reference to the accompanying drawings, throughout which like parts are designated by like reference numerals, and in which.

DETAILED DESCRIPTION OF THE PREFERRED EMBODIMENTS

Figure 3:
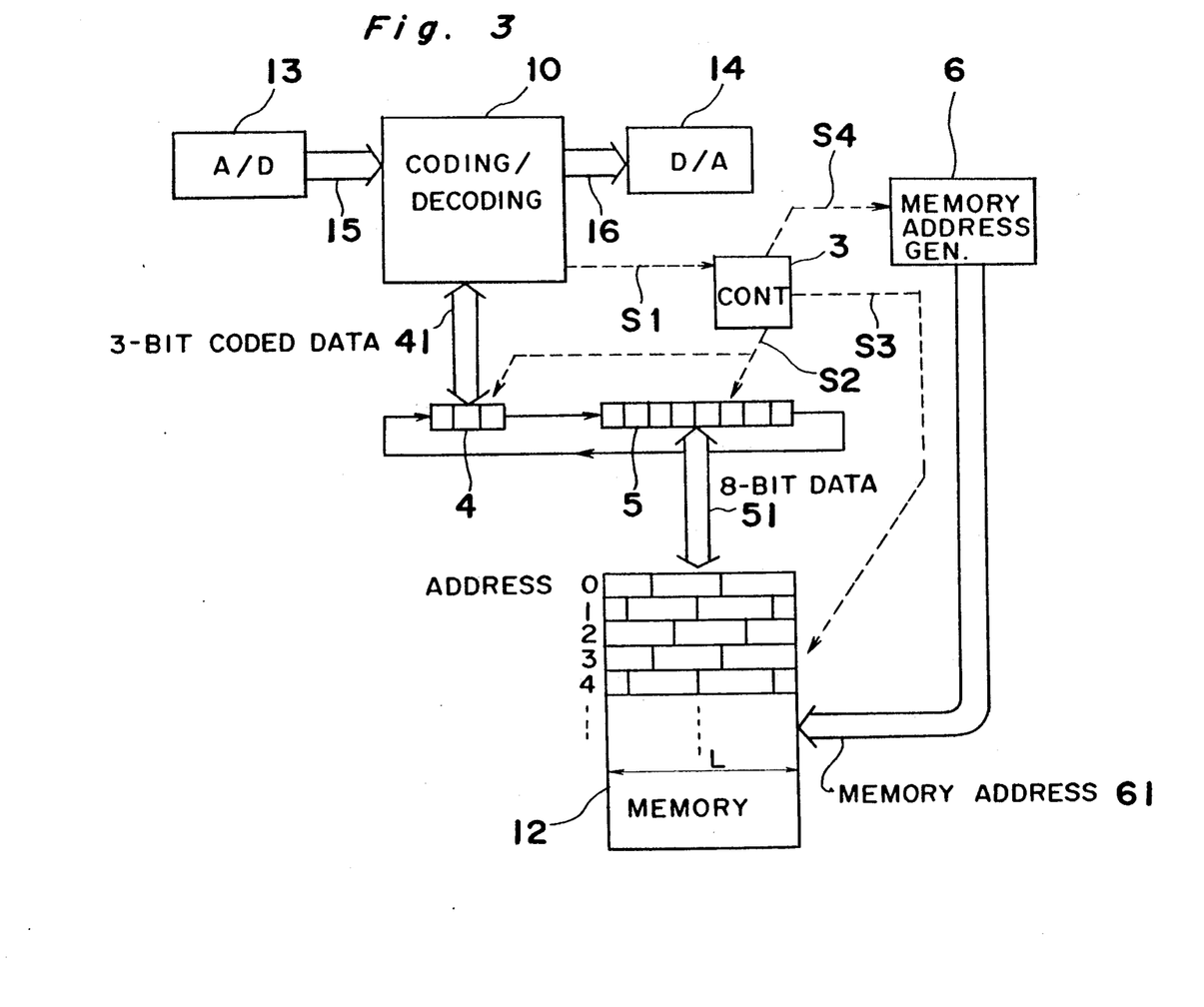
FIG. 3 is a block diagram of a voice recording and reproducing apparatus according to one preferred embodiment of the present invention.

Referring to FIG. 3, a block diagram of a digital voice recording and reproducing apparatus according to one embodiment of the present invention is shown, which employs, as an example, an adaptive differential pulse code modulation method (hereinafter referred to as an ADPCM method) using three-bit word lengths.

In FIG. 3, during a recording mode, a voice signal 15 in digital form, which has been converted by an A/D converter 13, is inputted to a coding/decoding circuit 10 and outputted therefrom as encoded data 41 (comprising a string of three-bit words) to register 4 and in turn to register 5, and stored in memory 12. During a reproducing (playback) mode, the three-bit encoded data is read out from memory 12 is, and applied through registers 5 and 4 to coding/decoding circuit 10. The data is then decoded into a voice signal 16 and outputted to a D/A converter 14. The read/write memory 12 has a plurality of data storing segments which are given respective address numbers 0, 1, 2, . . . Each segment is capable of storing, at maximum, eight-bit, according to this embodiment.

A three-bit shift register 4 has the same bit length (word length) as the coded data 41 and is designed to receive in parallel and temporarily store the three-bit coded data 41 from the coding/decoding circuit 10 during the recording mode, and to send in parallel the three-bit coded data 41 to the coding/decoding circuit 10 during the reproducing mode.

On the other hand, an eight-bit shift register 5 has the same word length as the memory 12 and is designed to send, in parallel eight-bit data 51 to memory 12 during the recording mode, and to receive, in parallel and temporarily store eight-bit data 51 from memory 12 during the reproducing mode.

Shift registers 4 and 5 constitute a looped shift register, and are serially connected with each other so that, in one shift operation, the least significant bit of the shift register 4 is moved to the most significant bit of the shift register 5, and, the least significant bit of the register 5 is moved to the most significant bit of the register 4.

A memory address generating circuit 6 generates and supplies a memory address 61 to the memory 12. A control circuit 3 is connected via control lines S2, S3 and S4 to registers 4 and 5, memory 12 and memory address generating circuit 6, respectively, so as to send appropriate control signals thereto upon receipt of an input signal S1 from the coding/decoding circuit 10.

Figure 4:
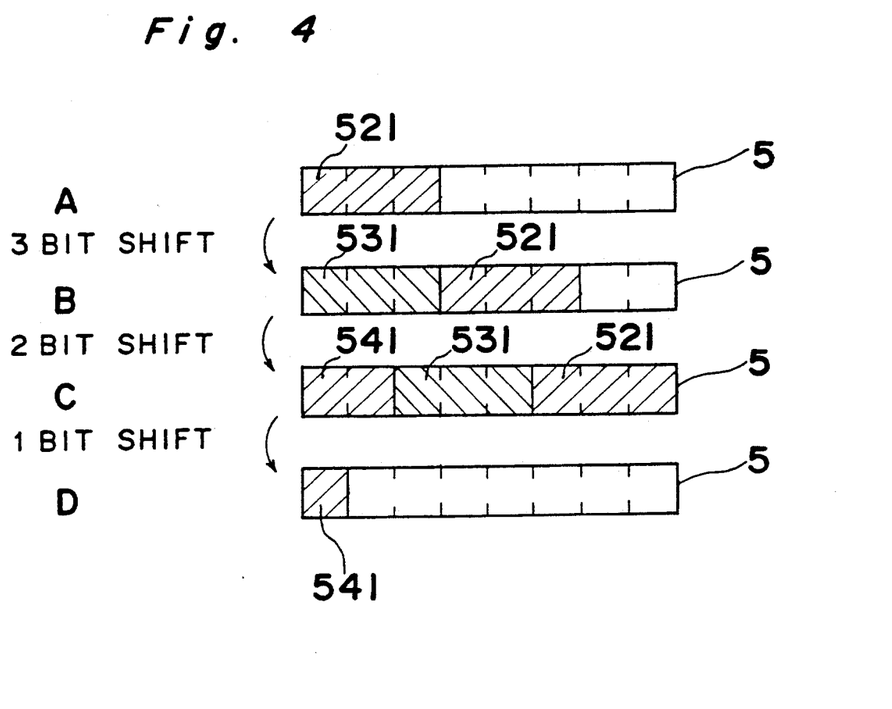
FIG. 4 is a diagram showing one example of the data shift in a register, effected during the recording time.

In an encoding operation (recording mode), a voice signal is inputted to coding/decoding circuit 10 in the form digital data 15 at a predetermined sampling rate. The coding/decoding circuit 10 encodes each input data word 15 and outputs, in parallel three-bit coded data words 41 to the register 4. Simultaneously with the output of the three-bit coded data 41, the coding/decoding circuit 10 also outputs a control signal S1 to the control circuit 3 to indicate that data 41 has been outputted. Upon receipt of the signal S1, control circuit 3 outputs clock signals S2 to registers 4 and 5 to effect a rightward shift of three bits, in the direction of arrow, registers 4 and 5 functioning together as one 11-bit shift register. As a result, as shown in FIG. 4, diagram A, a three bit data word 521 in register 4 is moved to the first three bit positions of the register 5, whereby three-bit register 4 becomes free for the next use. (Actually, three-bits of data at the right end in the register 5 is also moved, but will not be used.)

In the next cycle, when the next data word 15 is inputted, a second encoding is effected by the coding/decoding circuit 10, and the data in registers 4 and 5 is again shifted to the right by three bit positions in the same manner as described above. Accordingly, a three-bit data word 531 is stored in the first three bit positions of register 5, as shown in diagram B in FIG. 4. In this case, the previously entered data 521 is moved to right by three bit positions, leaving two free bits at the right end of register 5.

In a third cycle, the coding/decoding circuit 10 further encodes data 15, and thus, the data in registers 4 and 5 are similarly shifted to the right by three bit positions. In this case, when only shifting of the two bit positions is effected, the 8-bit register 5 is already filled with the coded data from coding/decoding circuit 10, as shown in diagram C in FIG. 4. Thereupon, by the control signal S3 from control circuit 3, the 8-bits of data in the register 5 are transferred in parallel and stored in memory 12, thereby emptying register 5. At this time, memory address generator 6 produces a memory address 61, such as address 0, for designating a storing location in memory 12. After storing the first segment (e.g., with address 0) in memory 12, the address generating circuit 6 increments the memory address 61 by one, ready for storing next segment (with address 1). In the meantime, the data in registers 4 and 5 are shifted rightwardly by one bit position, thus completing the shift of three total bits. The result is such that the register 4 is freed again, while register 5 receives only one remaining bit of data 541 from register 4, as shown in diagram D in FIG. 4.

After every coding step taken in circuit 10, the data in register 4 is shifted serially to register 5 to the left end thereof. Whenever the 8-bit register 5 is filled with the data, even during the middle of the three-bit shifting operation, the data in register 5 immediately shifted, in parallel, to memory 12, and thereafter, incrementing the address 61. The control signals S3 and S4 are produced after every eight-bit shift effected in register 5.

Figures 6, 7:
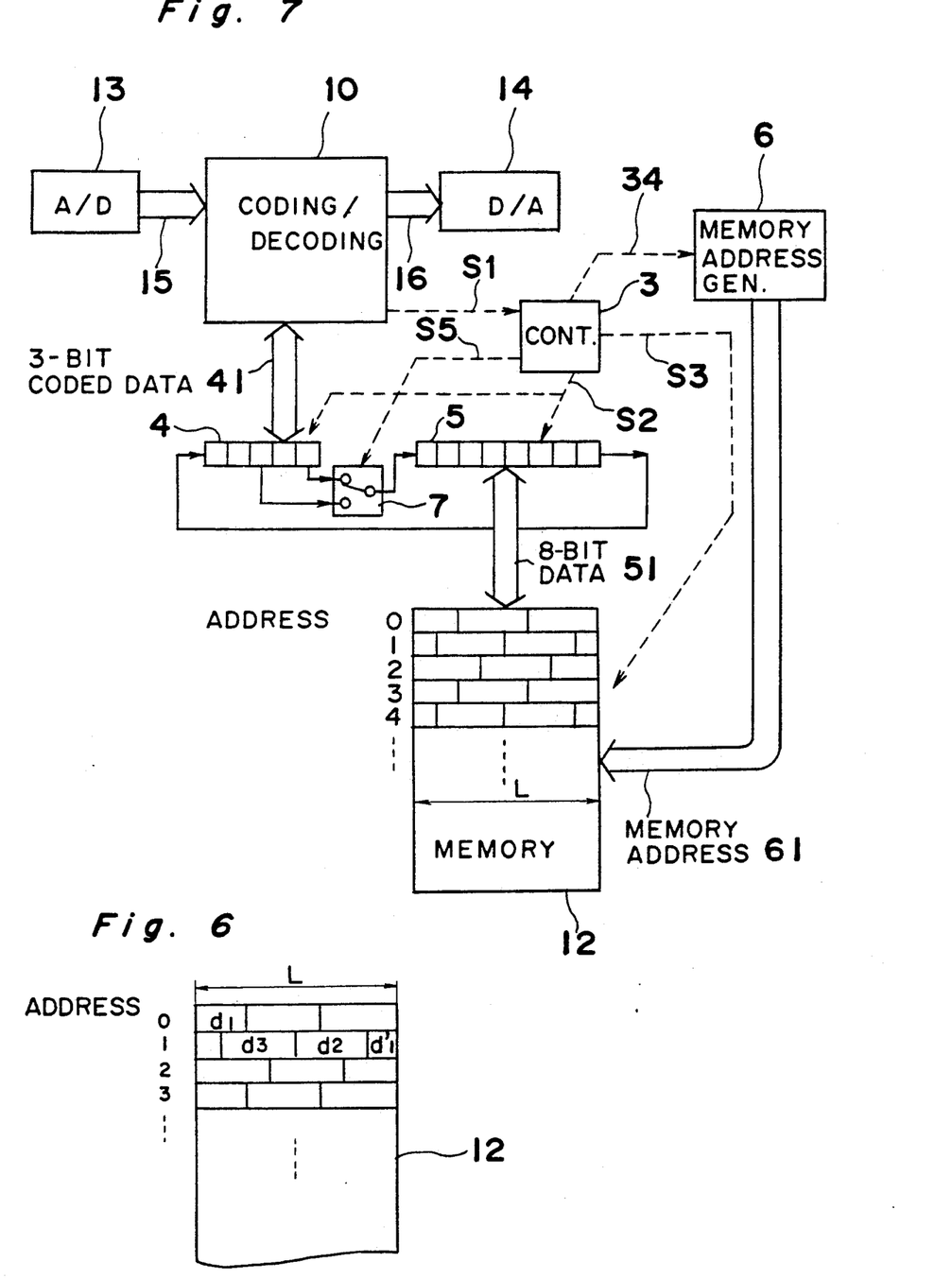
FIG. 6 is a diagram showing one example of the structure of a memory having coded data written therein by a voice recording and reproducing apparatus according to the present invention.
FIG. 7 is a block diagram of a voice recording and reproducing apparatus according to another embodiment of the present invention.

By the aforementioned operation, the three-bit coded data is efficiently written in the memory 12 without producing any useless area, as shown in FIG. 6

In a decoding operation (reproducing mode), control circuit 3 provides control signal S3 to memory 12 for reading out in parallel an eight-bit word from a segment, e.g., with address 0, in memory 12 designated by the memory address 61.

As the memory data is read out subsequent to the generation of the control signal S3, the control circuit 3 then outputs the control signal S4 to the address generating circuit 6 for incrementing the memory address 61 by one, thereby preparing for the reading of the next eight-bit word of memory data. Thereafter, control circuit 3 outputs three clock signals S2 to registers 4 and 5, whereby the data if registers 4 and 5 is shifted rightwardly in the direction the arrow by three bit positions. The registers 4 and 5 operate together as a looped shift register.

Figure 5:
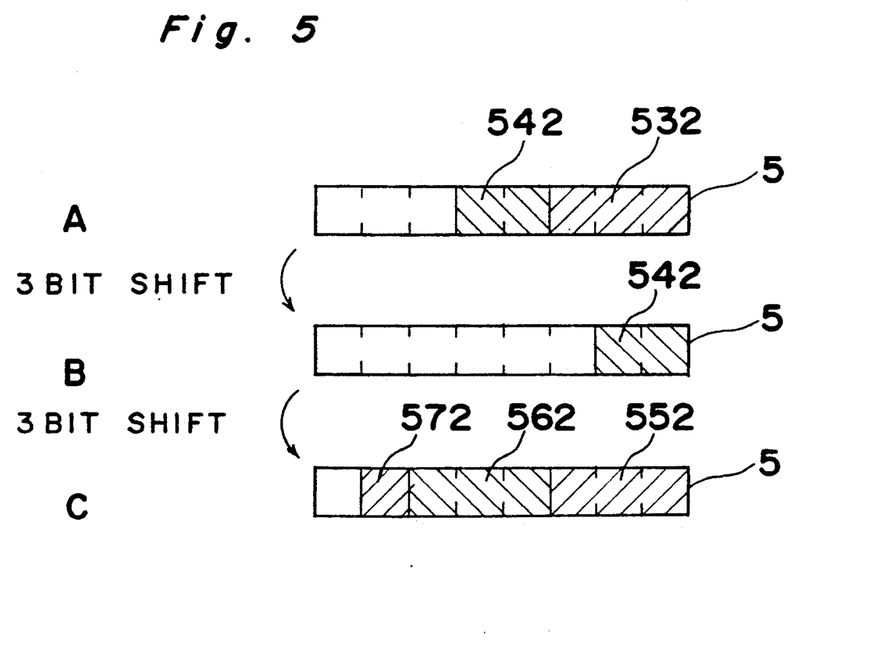
FIG. 5 is a diagram showing one example of the data shift in a register, effected during the playback time.

Thus, during the reproducing mode, the three bit data positioned at the right end of the register 5 is moved to the register 4, resulting in free area of three bit positions located at the left end of the register 5, as shown in diagram A in FIG. 5. (Actually, three bits of data from register 4 are positioned at the freed three bit positions.)

Thereafter, coding/decoding circuit 10 reads the coded data 41 from register 4 and decodes the data after every predetermined read out cycle to produce decoded synthesized data 16 which is applied to D/A converter 14. Thereupon, an original voice waveform is reproduced.

More specifically, after receiving the coded data 41 from register 4, coding/decoding circuit 10 produces signal S1 to control circuit 3 for indicating that the data 41 in register 4 has been transferred. Thereafter, control circuit 3 outputs three clock signals S2 to registers 4 and 5 for shifting the data therein for three bit positions rightwardly. As seen from diagrams A and B in FIG. 5, by the three bit shifting operation, the three-bit data 532 at the right end of register 5 is moved to the register 4 and, at the same time, the two bit data 542 is shifted to the right end of register 5. The remaining one bit of the data 542 will be read out from memory 12 in the next cycle.

In the next decoding cycle, after the coded data 41 in register 4 is transferred to coding/decoding circuit 10, the data in shift registers 4 and 5 is shifted by three bit positions. In this case, after shifting the data by two bit positions, register 5 is emptied. Thus, control circuit 3 outputs the control signal S3 to memory 12, so that a fresh 8-bit word of data is read from one segment in memory 12 into register 5. The fresh -8-bit data word includes the remaining one bit of the 3-bit word 542. At this time, memory address 61 is incremented by one by the control signal S4 applied to address generating circuit 6. Then, by the remaining one bit shifting operation in this cycle, the remaining one bit of the data 542 is sent to the register 4 from the right end of register 5. Accordingly, register 4 now receives full three-bit data 542, which is then transferred, in parallel, to coding/decoding circuit 10 as coded data 41 in the next decoding cycle. At the end of this cycle, register 5 carries data as shown in diagram C in FIG. 5.

In a similar manner, during each sampling cycle, coding/decoding circuit 10 reads the three bit coded data 4 from register 4, and then, three bit data is shifted from register 5 to register 4. Even during the middle of a sampling cycle, a fresh 8-bit data is read out from the memory 12 and stored in register 5, every time register 5 becomes empty. Therefore, it is so arranged that the coding/decoding circuit 10 is always ready to read out the data 41. If register 5 is emptied during the middle of the three-bit shifting operations from register 4, a fresh 8-bit data is read out from the memory 12 at that time, and thereafter, the portion of the remaining three-bit shifting operation will be carried out. Accordingly, even when a three-bit coded data word is stored in memory 12 separately in two lines, i.e., in two different addresses, as shown in FIG. 6, the data will be united as a full three-bit coded data word when it is sent to register 4.

Since register 5 is emptied after every eight-bit shifting operation, each of the control signals S3 and S4, which control respectively, reading of the eight-bit memory data 51 from memory 12 to register 5, and incrementing the memory address 61, is produced after every eight clock signals S2.

Although the coded data word length is three bits in the foregoing description, coding and decoding can be realized by any desired coded data word length, if the bit length of register 4 and the number of bits of the shifting during each sampling cycles are made equal to the coded data word length.

In addition, although the word length in the memory 12 is eight bits in the foregoing description, the word length for the memory can be changed to any desired word length, if the bit length of the register 5 and the word length of the memory are rendered equal. In this case, if the bit length of each data storing segment (maximum word length) in memory 12 is defined as N, reading and writing between register 5 and memory 12 is done once after every N-bit shifting operation of registers 4 and 5.

A second embodiment of the present invention will be discussed hereinbelow with reference to FIG. 7.

The difference is that register 4 can be switched between a three-bit shift register or a five-bit shift register by a control signal S5 from the control circuit 3, which controls switching circuit 7. Thus, coded data words 41 of five bit length or three bit length can be selectively used by a suitable bit length indication signal applied to control circuit 3.

Since the operation of the apparatus of the second embodiment is the same as that of the first embodiment, the description thereof is omitted.

Referring to the relation between the quality of the synthesized voice and the coded data length, in general, the voice quality is good when the coded data word length is long. But, when the coded data word length is long, the maximum recording or reproducing time using memory 12 is shortened because the number of coded data words that can be memorized in memory 12, having a fixed capacity, is reduced. On the contrary, when the coded data word length is shortened, the voice quality becomes poor, but the data can be recoded or reproduced for a longer time because the number of coded data words that can be memorized in memory 12 is increased. From this viewpoint, the user can select which is more important, the voice quality or recording time, according to the embodiment of FIG. 7, by tuning a suitable switch (not shown) to select the coded data word length.

In the embodiment of FIG. 7, although the coded data word length can be selectively switched between five-bits and three bits, it is possible to have other bit lengths for the coded data. Furthermore, if switching circuit 7 is of a type having many input terminals, three or more selections of the coded data word length will be available.

The first embodiment described earlier will be described more in detail hereinbelow.

Specifically, a voice recording/reproducing LSI (large scale integrated circuit) employing the ADPCM (adaptive differential pulse code modulation) method will be explained, in which voice waveforms are coded by the three-bit word length and stored in a memory of the eight-bit word length, or decoded by the reverse operation.

Figure 8:
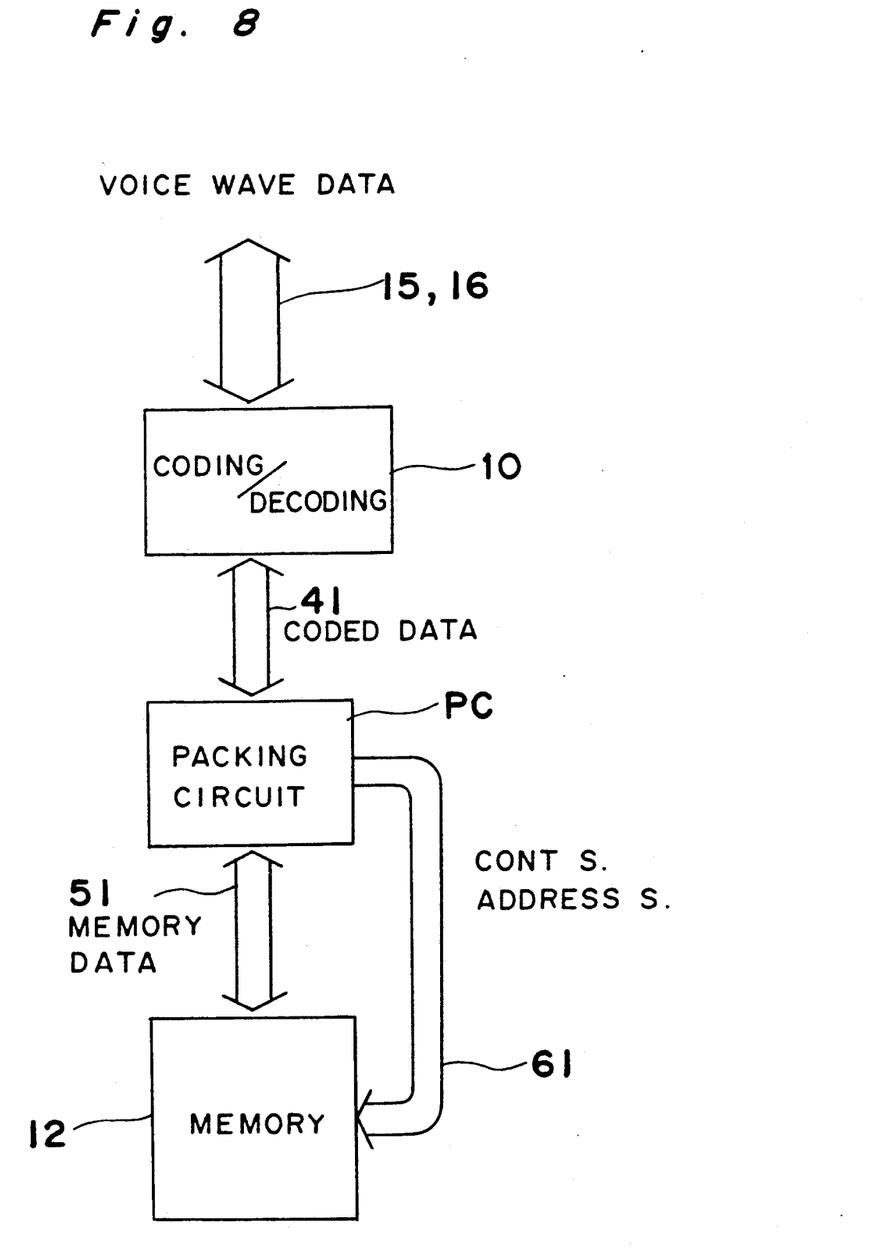
FIG. 8 is a block diagram schematically showing an LSI (Large Scale Integration) construction used in the voice recording and reproducing apparatus according to a further embodiment of the present invention.

Referring to FIG. 8, a schematic block diagram of the above-referred voice recording/reproducing LSI is shown. When the voice is to be recorded, the data of voice waveform 15 after it is A/D converted is inputted and encoded in the coding/decoding circuit 10. The coded data 41 is then outputted to a packing circuit PC. Accordingly, the coded data 41 can be written into the memory 12 all together in the following manner. That is, with reference to FIG. 6, for example, the coded data 41 is sequentially written into an address "0" in the memory 12, and if a coded data d1 exceeds the segment length L of the memory 12, the exceeding part d1' of the data d1 is, together with the succeeding coded data d2, d3 . . . , carried over to the next segment, for example, with address "1". Thus, the total data length of the data d1', d2 and d3 is made the same as the segment length L of the memory 12. (This operation will be hereinafter referred to as a packing operation.)

Thus, the three-bit coded data is packed into the eight-bit memory data 51 and outputted from the packing circuit PC to memory 12. The memory data 51 transferred to memory 12 is written in a segment with a designated address indicated by means of address data.

On the contrary, by the reverse operation, the memory data 51, read out from the memory 12, is separated to each coded data word 41 by the packing circuit PC, and applied to the coding/decoding circuit 10. Then, the coded data 41 in the coding/decoding circuit 10 is decoded and D/A converted, for producing data 16 representing voice waveforms.

During a data transfer mode, in which data is transferred from one area to another area within memory 12, one memory data word 51 which is as stored in one segment in of memory 12 is read out, and is written in a different segment in memory 12. This operation is successively carried out until the read-out address becomes a preset address while the read-out address and the write-in address are changed by the packing circuit PC.

Figure 9:
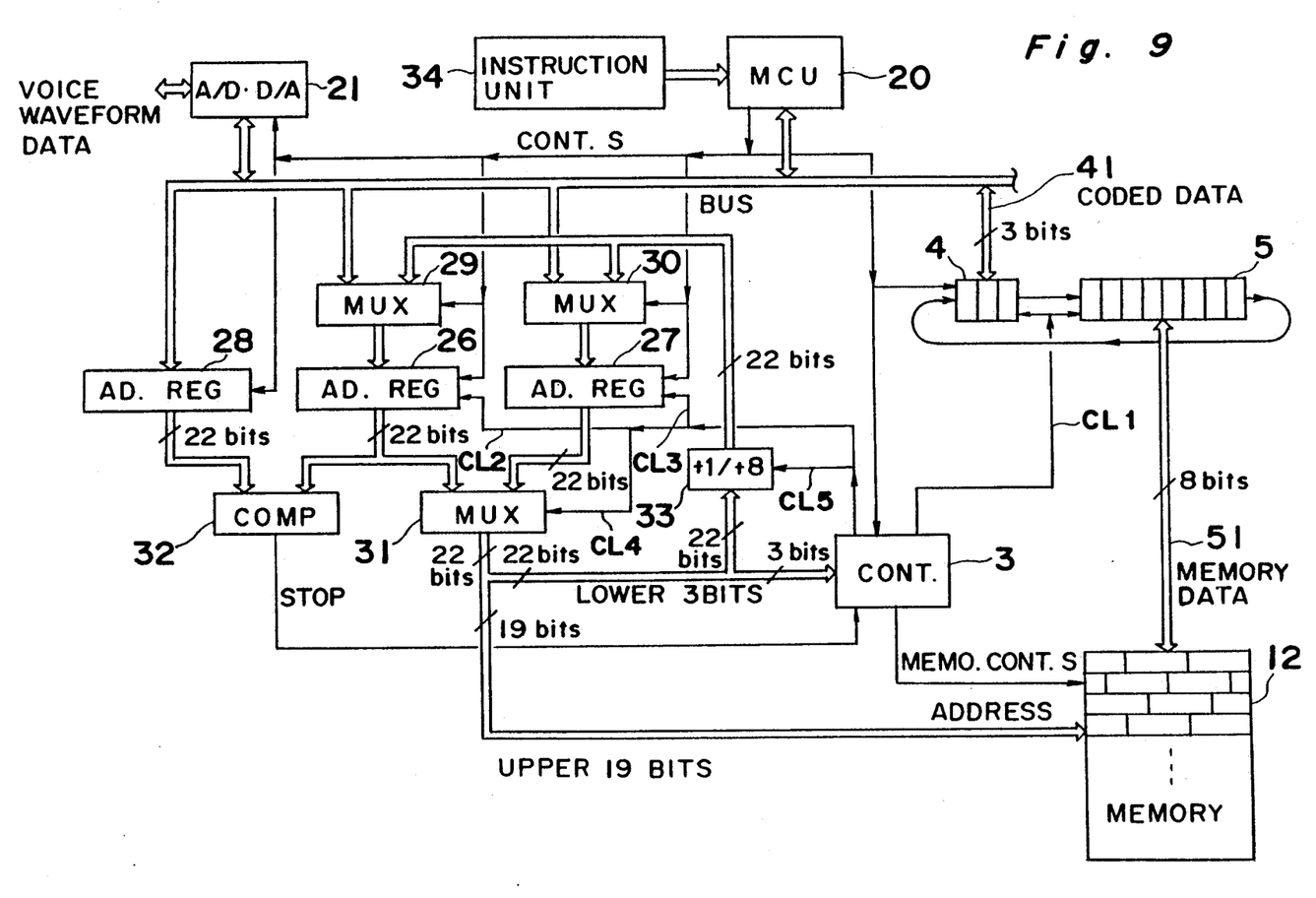
FIG. 9 is a detailed block diagram of the LSI construction of FIG. 8.

Referring to FIG. 9, a detailed block diagram of the voice recording/reproducing LSI of FIG. 8 is shown. A converter 21 for A/D or D/A conversion and a microcomputer 20 (hereinafter referred to as an MCU) are provided for defining the coding/decoding circuit 10. Also, control circuit 3, registers 4 and 5, address registers 26, 27 and 28, multiplexers 29, 30 and 31, a comparator 32, a +1/+8 circuit 33 are provided for defining the packing circuit PC.

In the voice recording/reproducing LSI of FIG. 9, all components, except memory 12 and instruction unit 34, are formed on the LSI. The MCU 20 is a main controller and is provided for controlling the voice recording/reproducing (coding/decoding) operation. Moreover, MCU 20 controls to set an initial value of each of address registers 26, 27 and 28. The instruction unit 34 is defined by e.g., a switch or the like, and produces instructions for recording, reproducing or erasing the data to the MCU 20.

The converter 21, during the recording mode, performs A/D conversion of the analog voice waves inputted every predetermined sampling cycle, T seconds, and outputs digital data of the same to MCU 20. During the reproducing mode, converter 21 performs D/A conversion of the digital voice data inputted from MCU 20 and outputs analog voice waves.

During the recording mode, three-bit register 4 receives and sends three-bit data 41 encoded by MCU 20 to the 8-bit register 5. On the other hand, during the reproducing mode, register 4 receives and sends the coded data from register 5 (and further from the memory 12) to MCU 20. Registers 4 and 5 form a looped shift register. Accordingly, during the recording mode, when three shift clock signals CL1 are applied from control circuit 3, the three-bit coded data in register 4 is shifted rightwardly to register 5 in the above described manner.

Address register 26 outputs address data through multiplexer 31 to an address data receiving terminal of memory 12 during the recording mode or reproducing mode. During data transfer, address registers 26 and 27 output data representing an address selected by multiplexer 31 to memory 12. Also during data transfer, register 28 stores an address of a maximum segment, up to which the data transfer should be carried out.

The multiplexers 29 and 30 select and output address data from the MCU 20 in response to the control signal from the MCU 20 only when the MCU 20 writes the address data into the address register 26 or 27. In the cases other than the above, multiplexers 29 and 30 select and output address data which is incremented with either "000...0001"(=1) or "000...1000"(=8) by the +1/+8 circuit 33.

The +1/+8 circuit 33 adds "000...0001"(=1) or "000...1000"(=8) to the address data outputted from address register 26 or 27, and inputs the added data back to the address register 26 or 27. Therefore, the address fed to the memory 12 is incremented by "000...0001"(=1) or "000...1000"(=8) every time the clock signal CL2 or CL3 from the control circuit 3 is inputted to the address register 26 or 27, respectively. The addition of the "000...0001"(=1) or "000...1000"(=8) by the +1/+8 circuit 33 is switched by the clock signal CL5 from the control circuit 3, so that "000...0001"(=1) is added during the recording or reproduce mode, while "000...1000"(=8) is added during the data transfer mode.

The control circuit 3 generates, in accordance with a control signal from the MCU 20, a select signal CL4 to the multiplexer 31, a shift clock signal CL1 to the registers 4 and 5, a clock signal CL5 for switching the +1/+8 circuit 33, clock signals CL2 and CL3 to respective address registers 26 and 27, and a memory control signal to memory 12, thereby to control the recording, reproducing or data transfer operation.

In the voice recording/reproducing LSI of the above structure, during the recording mode, the three-bit coded data 41 (obtained by encoding the inputted voice) is moved to three-bit register 4, and then to eight-bit register 5. When the eight-bit register 5 is filled with two and two third words of coded data (forming a packed data), the packed data 51, which has a plurality of three-bit coded data words packed into eight bits, is moved to and stored in a segment in memory 12 with a designated address.

During the reproducing mode, the memory data 51 is read out from the segment in memory 12 and is temporarily stored in register 5. Then, the memory data is sent out, three bits per cycle, from the register 5 to register 4 and, decoded by the MCU 20.

The recording/reproducing operation of the LSI will be described in detail hereinbelow.

Figure 10:
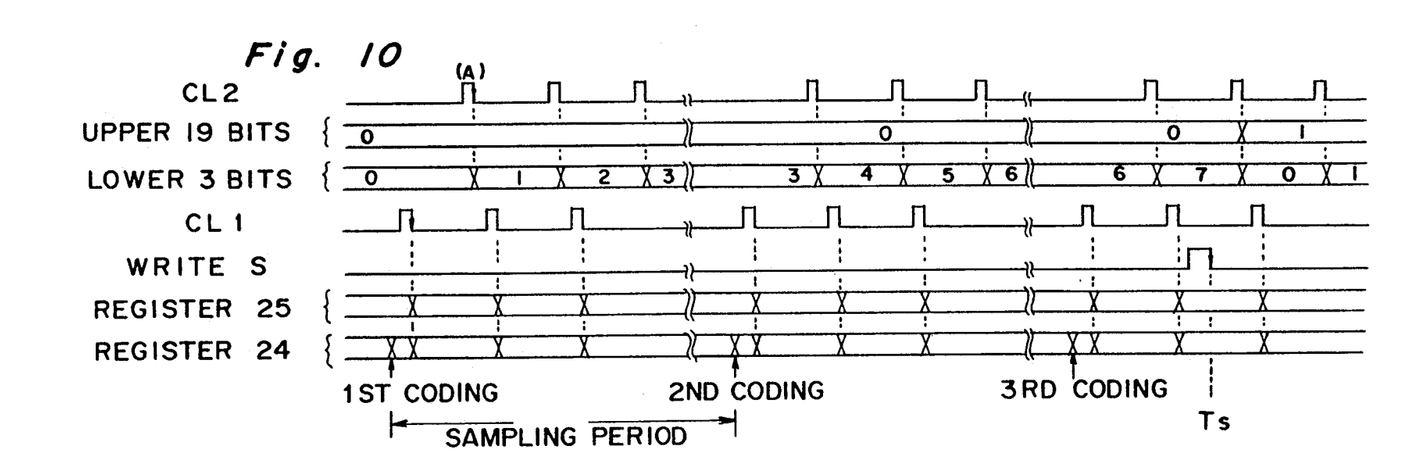
FIG. 10 is a timing chart of various signals obtained during the recording time.

(A) Recording (Encoding) Mode:

FIG. 10 is a timing chart of various signals obtained during the recording mode, and FIG. 4 is a diagram showing the shifted data in register 5. Now, the recording operation will be described with reference to FIGS. 9, 10 and 4.

When the first coding starts, an initial value of the 22-bit address data (in the instant embodiment, "000...0000") is taken into address register 26 through multiplexer 29 by a control signal from MCU 20. The most significant 19 bits of the initial value "000...0000" of the 22-bit address data are used as an address for indicating a segment in memory 12 when the packed coded data in the register 5 is to be supplied to memory 12, and the least significant three bits of the initial value "000" are used as a control signal for control circuit 3. Also, the 22-bit address data is applied to +1/+8 circuit 33.

The voice digital data, after being A/D converted by converter 21, is encoded by MCU 20 with a timing shown in FIG. 10, which is in turn stored in the register 4. Thereafter, the coded data stored in the register 4 is shifted rightwardly by the shift clock signal CL1 from control circuit 3.

In the meantime, the address data word "000...0000" taken into the address register 26 is supplied to the multiplexer 31. Since multiplexer 31 is designed so as to receive a LOW level clock signal CL4 during the recording mode, it selects the address data "000...0000" from the address register 26. The most significant 19 bits "000 . . . 0" of the 22-bit word of address data are supplied to memory 12 as an address signal when the first packed data is written in memory 12. At the same time, the least significant 3 bits of the word of address data are inputted to control circuit 3.

Furthermore, the 22-bit address data word "000 . . . 0000" is inputted to the +1/+8 circuit 33. Thus, +1/+8 circuit 33 is switched to the "+1" side by the clock signal CL5 from the control circuit 3. Accordingly, "1" is added to the inputted address data "000 . . . 0000", so that the 22-bit data is outputted as "000 . . . 0001" to the multiplexer 29. In this case, multiplexer 29 is arranged to select the data from the 1/+8 circuit 33 by the control signal from MCU 20. Thus, the 22-bit data "000 . . . 0001" from the +1/+8 circuit 33 is outputted as an address data by the multiplexer 29 to the address register 26. The address data "000 . . . 0001" is taken into the address register 26, at a time point (A) shown in FIG. 10, in response to clock signal CL2 outputted in accordance with the shift clock CL1 from the control circuit 3.

Of the 22-bits of address data "000 . . . 0001" taken into the address register 26 and passing through the multiplexer 31, the most significant 19 bits "000 . . . 0" are supplied to the memory 12 as address data for designating a segment in memory 12 for storing the first packed data. At this point in time the most significant 19 bits of the address data are still "000 . . . 0"(=0). At the same time, the least significant 3 bits "001" are inputted to the control circuit 3, while the shift clock CL1 from control circuit 3 is applied to registers 4 and 5, so that the coded data stored in the registers 4 and 5 are shifted rightwardly by one bit.

Thereafter, in a similar manner as described above, the address data "000 . . . 0001"(=1) is incremented by "1" by the +1/+8 circuit 33, and is taken into the address register 26 through the multiplexer 29. Then, the significant 19 bits "000 . . . 0" of the 22-bit address data "000 . . . 0010"(=2) as produced from multiplexer 31 are supplied to memory 12. At this point, the most significant 19 bits of the address data still remain "000 . . . 0"(=0). Simultaneously, the least significant 3 bits "010" are inputted to the control circuit 3, while shift clock signal CL1 to registers 4 and 5 is generated from control circuit 3 to effect a one bit shift of the coded data in the registers 4 and 5.

After repeating the above operation for three times, the three-bit data word 41 of the first coding is completely shifted from register 4 to register 5, leaving register 4 empty as indicated in diagram A of FIG. 4 where reference number 521 represents the coded data at the first coding. Thus, the first sampling cycle is completed.

After T seconds from the first coding, the second sampling cycle starts. Thus, in the same manner described above, A/D conversion is carried out by converter 21 and MCU 20. The obtained coded data is written in the register 4 by MCU 20. Then, the supply of the most significant 19 bits of the address data from the address register 26 to the memory 12, the supply of the least significant 3 bits of the data into control circuit 3, and the addition of "1" to the 22-bit address data by the +1/+8 circuit 33 are repeated three times. Accordingly, the three-bit data word in register 4 is shifted to register 5. As a result, the contents of register 5 will be as shown in diagram B of FIG. 4 in which reference number 531 represents the data encoded during the second coding time. At the end of the second sampling, the address data outputted from address register 26 through the multiplexer 31 is increased to "000 . . . 0110"(=6) and, the most significant 19 bits thereof are still "00 . . . 00", while the least significant 3 bits are changed to "110".

Thereafter, the third sampling cycle starts. Thus, the data in registers 4 and 5 is shifted rightwardly by three bit positions in accordance with the shift clock signal CL1 from control circuit 3. At this time, when the data in registers 4 and 5 is shifted by two bit positions, as shown in diagram C of FIG. 4, the eight-bit register 5 is filled with the first coded data 521, second coded data 531 and the first 2 bits of the third coded data 541. At this time, as shown in FIG. 10, the 22-bit address data is "000 . . . 0111"(=7), with the most significant 19 bits being "000 . . . 0"(=0) and the least significant 3 bits being "111"(=7). Since the least significant 3 bits of the address data become "111", the control circuit 3 produces a HIGH level signal (write signal) to a WRITE ENABLE PIN in memory 12.

Consequently, the memory data packed in 8 bits register 5 is written in memory 12 at a segment with address "0", as indicated by the most significant 19 bits "000 . . . 0" of the address data.

After the eight-bit memory data is written in memory 12 in the above-described manner, the clock signal CL2 is inputted by the control circuit 3 to the address register 26. Thus, the 22-bit address data "000 . . . 0111" is incremented to "000 . . . 1000"(=8) by +1/+8 circuit 33, and is taken into the address register 26. In this case, the least significant 3 bits of the 22-bit address data become "000", and the most significant 19 bits of the address data are changed to be "000 . . . 1"(=1) because of the carry from the least significant 3 bits. The newly obtained 19-bit address data word "000 . . . 1" will be used for designating the next segment in memory 12 for writing the next packed eight-bit data word. Thus, the address data "000 . . . 1000"(=8) is outputted through multiplexer 31, the most significant 19 bits "000 . . . 1" thereof being fed to the memory 12, and the least significant 3 bits "000" thereof being inputted to the control circuit 3.

Thereafter, in order to continue the third shift of the third coded data 541, the shift clock signal CL1 is generated from the control circuit 3 to the registers 4 and 5. As a result, the data in the registers 4 and 5 is shifted rightwardly only by one bit, and the result will be as shown in the diagram D of FIG. 4.

In other words, during the recording mode, every time the least significant 3 bits becomes "000" (i.e., every time the register 5 is filled with the data), "1" is added to the most significant 19 bits of the address data by the carry over from the least significant three bits. Thus, the address data for memory 12 is incremented. Therefore, the least significant 3 bits of the address data repeats the values "0"-"7" every time eight bits of data are shifted through registers 4 and 5.

Thereafter, the same procedure is repeated such that: the data is coded by the converter 21 and MCU 20 and written in the register 4; the coded data in the register 4 is shifted rightwardly by three bit positions in accordance with three shift clock signals CL1 from the control circuit 3; and the shifted data is stored in the register 5. In this case, even at the middle of the shifting of the coded data, when the eight-bit register 5 is filled with the data, i.e., when the least significant 3 bits of the address data become "111"(=7), the eight-bit memory data packed in the register 5 is written in memory 12 at a segment designated by the address formed by the most significant 19 bits of the address data. Moreover, for the next writing of the memory data, the address of the memory 12 represented by the most significant 19 bits of the address data is arranged to be incremented by the carry over of the least significant three bits of the address data immediately after the instant writing of the memory data.

Thus, the three-bit ADPCM code is written in memory 12 without any waste of area as indicated in FIG. 6.

As is described hereinabove, when the voice is recorded by the LSI of the present invention, the three-bit data coded by converter 21 and MCU 20 is once stored in the register 4, and packed in eight-bit register 5 having the same maximum available word storing length as memory 12. When the eight-bit register 5 is filled with data, then, the eight-bit memory data packed in the register 5 is moved to memory 12. Therefore, even when the word length of the coded data is different from the segment length of memory 12, the coded data can be stored in memory 12 efficiently without any loss or waste of the data area in the memory.

Figure 11:
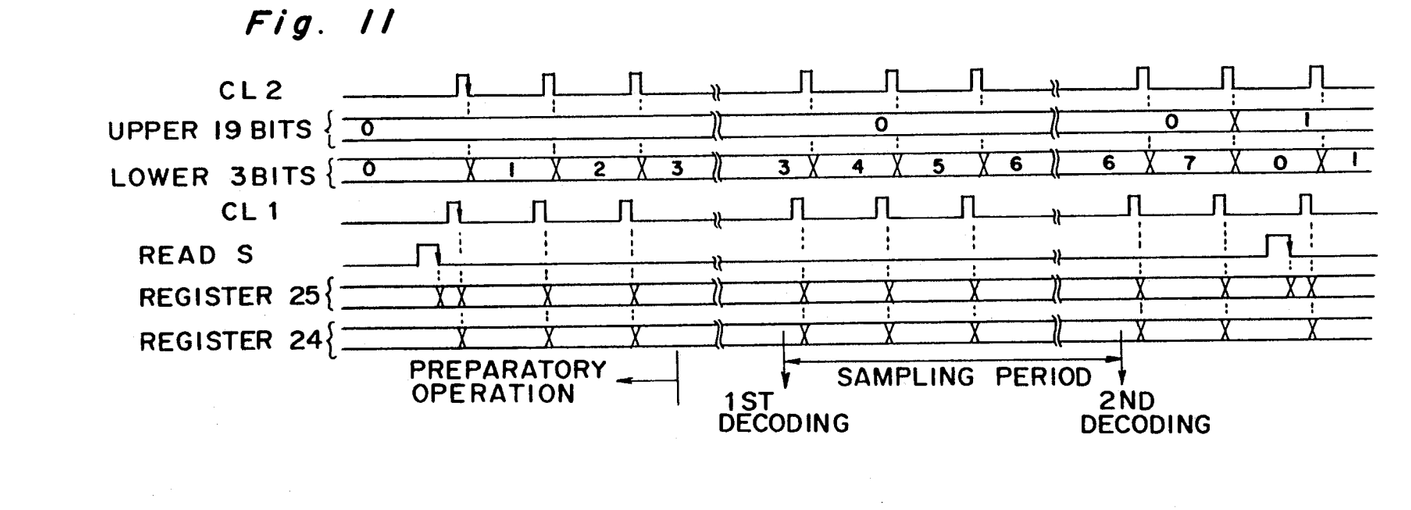
FIG. 11 is a timing chart of various signals obtained during the playback time.

(B) Reproducing (Decoding) Mode:

Referring to FIG. 11, a timing chart of various signals during the reproducing mode is shown. FIG. 5 shows the change of data in register 5 during the reproducing mode of operation. Referring to these FIGS. 11, 5 and 9, the operation under the reproducing mode will be described.

A preparatory operation for the reproducing mode starts when an initial value ("000...0000"(=0) which is the same as that for the recoding mode according to this embodiment) of the address register 26 is inputted by the MCU 20 to the multiplexer 29. Consequently, multiplexer 29 selects the address data "000...0000" by the control signal from MCU 20 and outputs the same data to address register 26. The address register 26 receives the address data "000...0000" outputted from the multiplexer 29 in accordance with the same control signal from MCU 20, which data is then supplied to the multiplexer 31.

During the reproducing mode, multiplexer 31 is adapted to select the address data from the address register 26 by the LOW level select signal CL4, as in a similar manner to that carried out during the recording mode. Therefore, multiplexer 31 selects the address data of "000...0000" from the address register 26. The most significant 19 bits of the 22-bit address data "000...0000" are supplied to memory 12 as an address data when the stored data should be read out from memory 12 for the first time. Simultaneously, the least significant 3 bits "000" are inputted to the control circuit 3.

As shown in FIG. 11, control circuit 3 produces a reading control signal which is a HIGH level memory control signal at a timing shown in FIG. 11 in accordance with a control signal from MCU 20. Consequently, one segment of data at address "0" is read out from memory 12 and stored in register 5. The address "0" is obtained by the most significant 19 bits of the address data "000...0000". In this case, if the coded data recorded at time point (A) is to be reproduced, the first coded data 522, second coded data 532, and the first 2 bits of the third coded data 542 (as packed in the first segment with address "0" of memory 12) are read out together from memory 12. Then, in the same manner as that carried out during the recording mode, the shift clock signal CL1 is outputted three times to shift the three-bit data from register 5 to register 4, and, at the same time, "1" is added three times to the 22-bit address data by the +1/+8 circuit 33. Since registers 4 and 5 constitute a looped shift register, data is shifted rightwardly by three bit positions. In this case, the relative timing between the shift clock signal CL1 and the clock signal CL2 is different from that observed during the recording mode, as apparent from FIGS. 10 and 11. As a result, the first three-bit coded data word 522 written in the address "0" in the memory 12 is shifted from register 5 to register 4 and is readily read out by the MCU 20. After that, register 5 stores the second coded data word 532 and the first 2 bits of the third coded data 542 as shown in diagram A of FIG. 5. The preparatory operation for the reproducing mode is thus completed.

The MCU 20, after reading out the three-bit coded data 522 to be decoded first from the register 4, decodes the data 522 by a timing shown in FIG. 11. Then, the obtained digital voice data is outputted to the converter 21 wherein the data is D/A converted into a synthesized voice waveform. After MCU 20 reads the first coded data 522 from the register 4 as described hereinabove, the control circuit 3 controls registers 4 and 5 to effect another three bit shift so as to set the second coded data word 532 in register 4. At the same time, the +1/+8 circuit 33 adds "001"(=1) three times to the address data. Therefore, the coded data 532 shown in diagram A of FIG. 5 is set in register 4. Thus, register 5 now has only the first 2 bits of the coded data 542, as indicated by diagram B of FIG. 5. The least significant 3 bits of the address data taken into the address register 26 become "110"(=6).

The MCU 20 reads out the coded data 532 of the second time from register 4 after T seconds have passed from the first coding, thereby to decode the coded data 532. Thereafter, for setting the third coded data 542 in the register 4, data in registers 4 and 5 are shifted rightwardly by three bit positions in a similar manner described above in accordance with the shift clock signal CL1 from the control circuit 3. At this time, however, since register 5 is emptied after the second shift, only 2 bits of the third coded data 542 are set in register 4. At that time, the address data is increased to "111"(=7) as indicated in FIG. 11. Thereafter, when this address data "111"(=7) is added with "001"(=1) by the +1/+8 circuit 33, the address data becomes "1000"(=8). The result is such that the least significant 3 bits of the address data will be "000", and the most significant 19 bits thereof is "000...1" because of the carry over from the least significant 3 bits. Then, control circuit 3 produces a HIGH level memory reading signal (memory control signal) to a read out terminal in memory 12, and the next one segment data at the designated address (the address data consequently represented by the most significant 19 bits of the address data is "1") is read out from memory 12.

In this manner, the memory reading signal is changed to a HIGH level signal immediately after the data in eight-bit register 5 is shifted completely to register 4. Thereafter, one fresh word (one fresh segment of data) is read out from a segment in memory 12 designated by address "1". In the fresh eight-bit word of memory data, the last bit of the third coded data word 542, a full three bits of the fourth coded data word 552, a full three bits of the fifth coded data word 562, and the first bit of the sixth coded data word 572 are packed.

Then, the last one bit of the coded data 542 is shifted from register 5 to register 4 for completing the data shifting of the third coded data word. Accordingly, register 4 is set with the full three-bit coded data word 542. Now, one bit position at the left end in register 5 is vacant as indicated by diagram C of FIG. 5.

In the same manner as described above, when the MCU 20 reads out the coded data to be decoded from register 4 every after T seconds, the data in registers 4 and 5 (which constitute a looped shift register), is shifted rightwardly by three bit positions by three shift clock signals CL1 from control circuit 3, and thus, the coded data to be decoded is set in register 4. Simultaneously, the 22-bit address data is added with "110"(=3). It is to be noted that even in the middle of the three bit shifts in registers 4 and 5, when the eight-bit register 5 is emptied (in actual, the register 5 is full of unnecessary coded data from the register 4), in other words, when the least significant 3 bits of the address data read "000", a fresh eight-bit memory data is read out of the memory 12. If this reading of the data from the memory 12 is done in the middle of a three bit shift in registers 4 and 5 for setting one coded data word in the register 4, the remaining shift is continued after a segment is read from the memory 12. Thus, three full coded data word for the next decoding is always set in the register 4 before the decoding. The address of the memory 12, represented by the most significant 19 bits of the address data, is incremented immediately before the reading of memory data.

As described above, during the reproducing mode by the use of the LSI of the present invention, the memory data which includes a plurality of three-bit coded data words packed in eight-bit long segments in memory 12 is temporarily stored in the register 5. Then, the three-bit coded data, comprising the memory data, is sent from register 5 to register 4, one three-bit word at a time, in the same order as that during the coding time. When MCU 20 decodes one set of coded data obtained from register 4, the next set of coded data is sent out from the register 5 to the register 4. If the register 5 is emptied, the memory reading signal outputted from the control circuit 3 is changed to a HIGH level signal, whereby the next memory data word, in the packed state, is read out from the next segment in memory 12 and is temporarily stored in register 5, which is done even during the middle of the transfer of the coded data from the register 5 to the register 4. Thereafter, the coded data is continuously transferred from the register 5 to the register 4.

(C) Data Transfer Within Memory 12:

According to the LSI of the present invention, during an erase mode, data in memory 12 located below the erased section is transferred so as to produce no vacant space within the data stored area. The data is transferred within memory 12 by repeating an operation such that an eight-bit word of packed data is read out from one segment in memory 12, and is transferred to another segment in memory 12, effected by the read-in address and write-in address. The operation of this data transfer within memory 12 will be discussed in more detail below.

Figure 12:
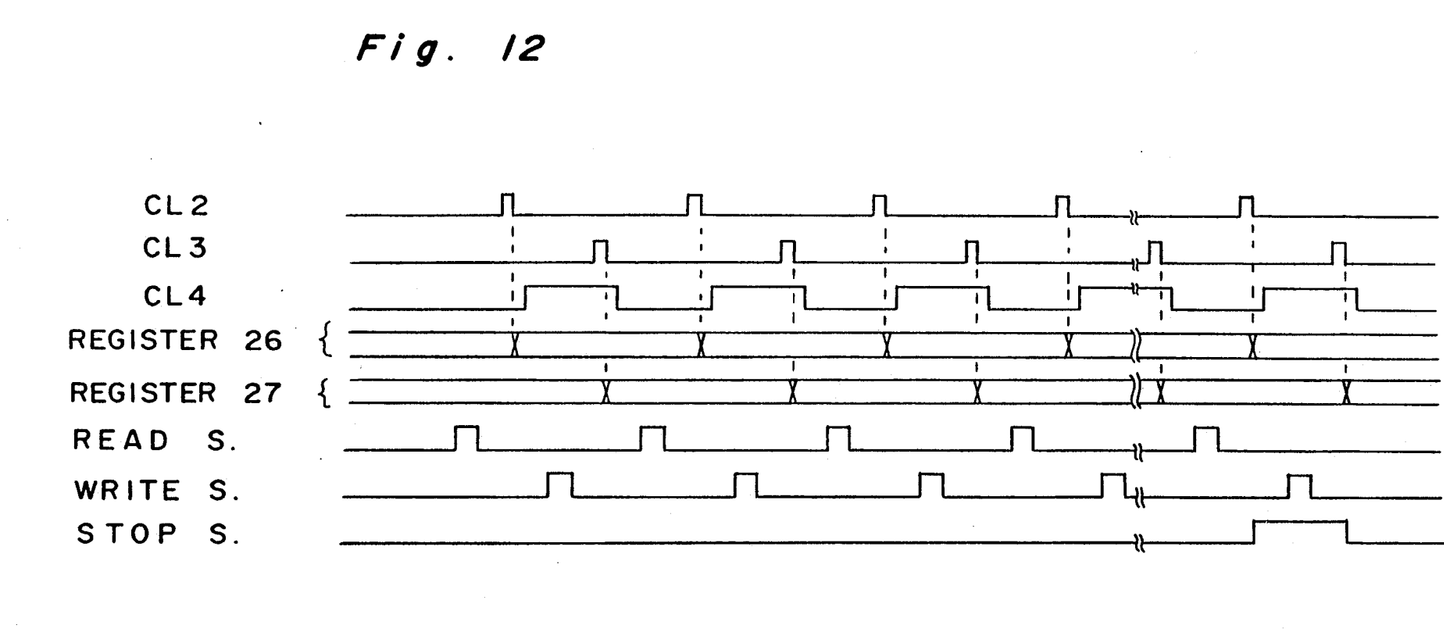
FIG. 12 is a timing chart of various signals obtained during the data transfer within the memory.
Figure 13A:
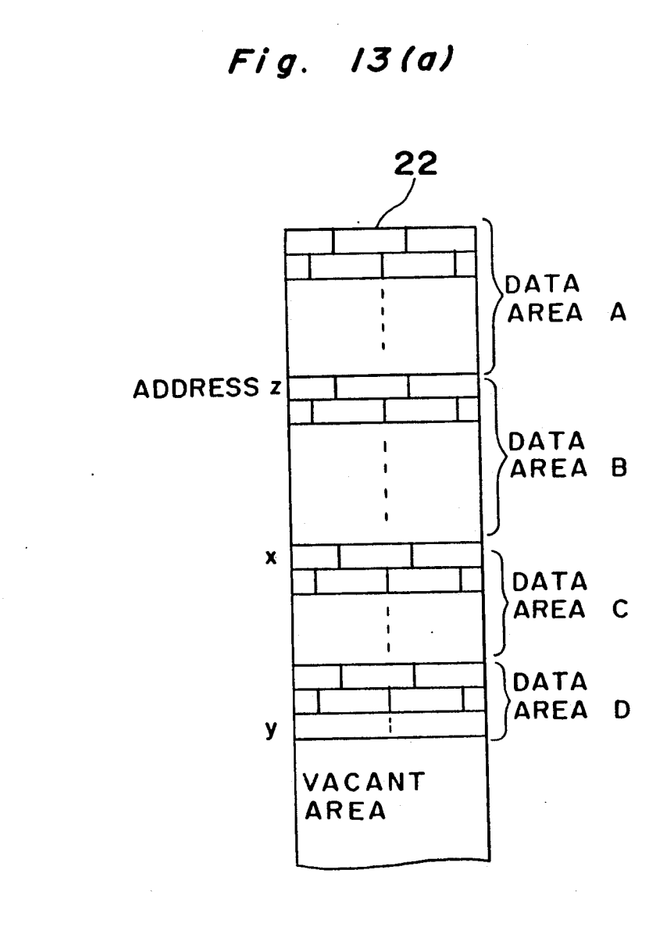
FIGS. 13(a) and 13(b) are diagrams showing one example of the change in the memory before and after the data transfer, according to the present invention.
Figure 13B:
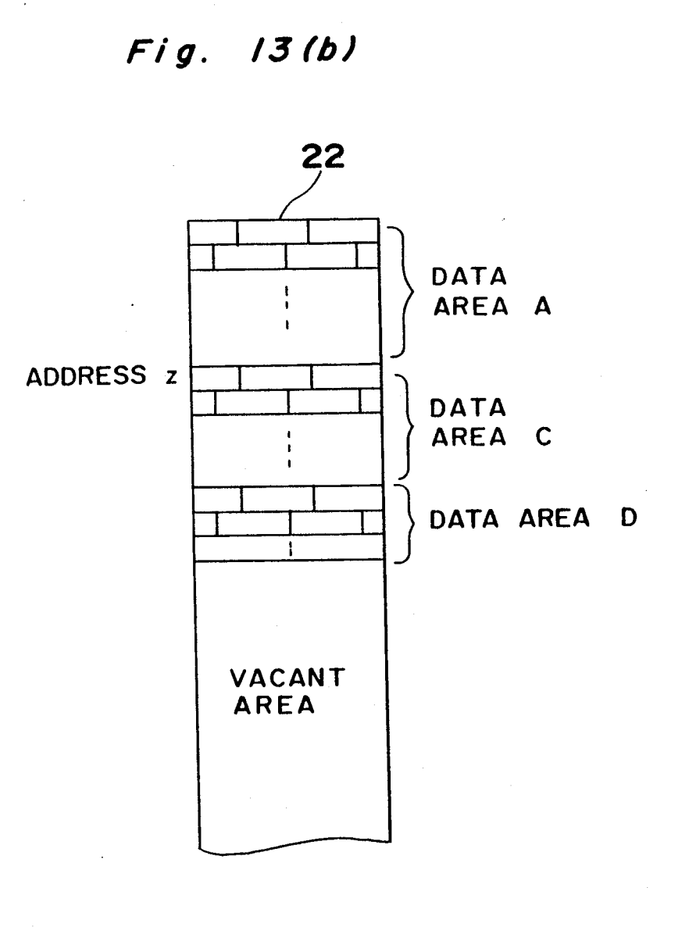

The operation of the data transfer will be described with reference to FIGS. 12, 13 and 9 showing, respectively, a timing chart of various signals, the change of the content of the memory 12, and a block diagram of the LSI.

Referring first to FIG. 9, when an erasing instruction for erasing a predetermined coded data of the already recorded voice is produced from the instruction unit 34, the predetermined voice coded data in the memory 12 is erased. Then, the data transfer is carried out so that all the coded data of voice recorded after the erased voice data is shifted forwardly by an amount equal to the area of erased data, thus leaving no vacant area in the data stored area.

During the data transfer within the memory, since the memory data in memory 12 is continuously read out segment by segment and written again in memory 12 in a similar manner, the most significant 19 bits of the address data should be continuously added with "000 . . . 0001"(=1), and the least significant 3 bits thereof become meaningless. Therefore, it is so arranged that the 22-bit address data is added with "000 . . . 1000"(=8) thereby to increase the value of the most significant 19 bits by "1".

In this case, as described earlier, the +1/+8 circuit 33 is switched to the "+8" side by the clock signal CL5 from the control circuit 3. For example, in the case where the multiplexer 31 selects and outputs the address data from the address register 27, the clock signal CL3 inputted from the control circuit 3 to the address register 27 causes the address data from the address register 27 to be increased by "000 . . . 1000"(=8).

Likewise, in the case where the multiplexer 31 selects the address data from the address register 26, the clock signal CL2 inputted from the control circuit 3 to the address register 26 causes the address data from the address register 26 to be increased by "000 . . . 1000"(=8).

Whether the multiplexer 31 selects the address data from the address register 26 or from the address register 27 is determined by the select signal CL4 generated from the control circuit 3. In other words, when a LOW level select signal CL4 is produced, the address data from the register 26 is selected, and conversely, when a HIGH level select signal CL4 is produced, the address data from the address register 27 is selected.

Prior to the data transfer within memory 12, the first segment address in memory 12, from which the data to be transferred should begin, is stored by the MCU 20 in the address register 26 through the multiplexer 29. Moreover, the first segment address of the destination to which the data is to be transferred (data area of the erased data) is stored in the address register 27 through the multiplexer 30. Similarly, the last segment address of the data to be transferred is stored in the address register 28.

More specifically, by an example given in FIGS. 13(a) and 13(b), in which it is supposed that the data in area B in FIG. 13(a) is erased, the first address "x" of the data area C of the memory 12 is stored in the address register 26; the first address "z" of the data area B is stored in the address register 27; and the address register 28 stores the last address "y" of the data area D.

Preparation for the data transfer within memory 12 is completed by the foregoing procedure.

When the data transfer start instruction is produced from MCU 20 and in turn from control circuit 3, as shown in FIG. 12, the select signal CL4 from the control circuit 3 is alternately changed between a LOW level and a HIGH level. Concurrently, when the select signal CL4 is at a LOW level, the clock signal CL2 to the address register 26 is at HIGH level. If the clock signal CL4 is at a HIGH level, the HIGH level clock signal CL3 is applied to address register 27. Therefore, the address data of the address register 26 which is added with "000 . . . 1000"(=8) and the address data from the address register 27, which is added with "000 ... 1000"(=8) are alternately selected by the multiplexer 31. Thus, the most significant 19 bits are supplied to memory 12 as a segment address for reading and writing in memory 12.

In the event that the address data from the address register 26 is selected by the multiplexer 31, with the select signal CL4 at a LOW level, and if the most significant 19 bits of the selected address data are supplied to the memory 12, a HIGH level memory reading signal is outputted from the control circuit 3, so that one segment of data of the eight-bit memory data is read from the above mentioned segment address and is transferred to register 5. Moreover, the selected address data (22 bits) from the address register 26 is added with "000 .. . 1000"(=8) by the +1/+8 circuit 33 to be taken into the address register 26 by the clock signal CL2. At the next moment, however, the select signal CL4 from the control circuit 3 is turned to a HIGH level. Therefore, the address data from the address register 27 is selected by the multiplexer 31. By the HIGH level memory writing signal from the control circuit 3, one segment word of eight-bit memory data, which has been read out from the memory 12 and stored in register 5, is written in the above mentioned segment address of memory 12. The address data (22 bits) from the address register 27 selected by the multiplexer 31 is added with "000 . . . 1000"(=8)- by the +1/+8 circuit 33 and taken into the address register 27 by the clock signal CL3.

While the data transfer within the memory is being carried out as described above, the address data from the address register 26 is inputted to a comparator 32. Further, the address data stored in the address register 28 is also sent to comparator 32. The value of the address data from the address register 26 is compared with that from the address register 28.

By repeating the above-described procedure, the memory data in the data areas C and D are read out sequentially in the order from the data having the younger address, and are written sequentially from the top of data area B. The data transfer within the memory is thus performed. During the data transfer, the value of the address data from the address register 26, which carries the address of the next segment from which the data should be read out in the next cycle, is compared with the address data of the address register 28 carrying the last address "y" in the data areas C and D in the memory 12. When these two addresses coincide, a STOP signal indicating the coincidence of the address data from the address registers 26 and 28 is outputted from the comparator 32 to the control circuit 3.

When the STOP signal is generated, control circuit 3 reads the last memory data word in the data area D from the memory 12 on the basis of the address data from the address register 26 which eventually coincides with that of the address register 28, and thereafter, the same is temporarily transferred to register 5, further transferred back to memory 12 at the segment with the address specified by the address data from address register 27. Now, the data transfer within the memory is completed.

In the above-described manner, all the data covering from the memory data in the first address "x" in the data area C to that in the last address "y" in the data area D shown in FIG. 13(a) are transferred to the data area B by the use of register 5. The memory data is transferred to the data area B from the front address therein. The content resulting in memory 12 is as shown of FIG. 13(b), with the vacant area formed not in the data stored area, but only after the last data area D.

During data transfer within memory, registers 4 and 5 which comprise looped shift register are not shifted. This is different from recording or reproducing mode operation. Register 5 is utilized as a buffer for temporarily storing the memory data read out from memory 12.

As has been described hereinabove, according to the data transfer within the memory using the LSI of the present invention, the memory data having the three-bit coded data packed in 8 bit words (or segments) is transferred by one packet from the data of the youngest address to that of the oldest address in the data area from which the memory data is to be transferred, to the data area to be erased. A vacant area resulting from the erasure of the data and the originally existing vacant area are integrally united into one consecutive vacant area in the memory 12 after the data transfer. Therefore, when the memory data packed in 8-bit words is outputted from the register 5 at a next time of recording, the memory data can be recorded from the front end of the vacant area, so that the memory 12 can be used fully to the last end.

In the foregoing embodiment, the data of voice waveforms is encoded by three-bit words and memorized in 8-bit words. However, the present invention is not limited to this embodiment. That is, it the effective bit number of the register 4 may be equal to any coded data word length, and at the same time, the effective bit number of the register 5 may be made equal to any word length of segments in the memory, whereby the number shifts of the registers 4 and 5 during one coding/decoding is equal to the number of bits of the coded word data length. Accordingly, coding/decoding by any desired word length can be attained.

Moreover, by rendering the effective number of digits of the register 4 variable, coding/decoding by two or more kinds of the word lengths can be realized by the same LSI.

Although the packing circuit PC is constructed by the control circuit 3, registers 4 and 5, address registers 26, 27 and 28, multiplexers 29, 30 and 31, comparator 32, and +1/+8 circuit 33 in the above-described embodiment, it is needless to say that the present invention is so restricted.

As is made clear from the foregoing description, the voice recording/reproducing apparatus of the present invention is provided with a coding/decoding means, a packing means and a memory data transfer means. Accordingly, in the voice recording/reproducing apparatus of the above construction, when recording is carried out, inputted data representing voice waveforms is encoded by the coding/decoding means and packed into segments of a memory by the packing means to be formed into memory data. The memory data is written into a write-in address on the memory, which address is sequentially incremented. Meanwhile, when the reproduction is effected, the packed memory data is read out from a read-in address on the memory which is sequentially incremented, returned to the coded data for decoding, and decoded by the coding/decoding means to produce data of synthesized voice waveforms. Furthermore, when the data transfer within the memory is done, the memory data in the packed state is continuously read out by the memory data transfer means from the read-in address on the memory, and continuously written in the write-in address on the memory. Therefore, even when the coded data has a different word length from the memory, the coded data can be packed into the word length of the memory and stored in the memory without any waste of memory.

Additionally, since the coded data is transferred every unit of the memory data packed by the word length of the memory during the data transfer, a consecutive vacant area is formed in the memory after the data transfer, contributing to an effective use of the memory.

Although the present invention has been fully described by way of example with reference to the accompanying drawings, various changes and modifications would be apparent to those skilled in the art. Therefore, unless such changes and modifications otherwise depart from the scope of the present invention, they should be construed as included therein.

What is claimed is:

1. A voice recording and reproducing apparatus comprising:
   a memory having a plurality of segments for storing data, each segment having a length of a predetermined number of bits;
   coding means for encoding or analog voice signal into digital coded data words having a predetermined length;
   packing means for packing more than one of said coded data words into packed data words having a length equal to the segment length, said packing means including a loop register for receiving and packing said coded data words; and
   storing means for storing said packed data words into respective segments in said memory.

2. A voice recording and reproducing apparatus comprising:
   a memory having a plurality of segments for storing data, each segment having a segment length of a predetermined number of bits;
   coding means for encoding an analog voice signal into digital coded data words having a predetermined length;
   packing means for packing more than one of said coded data words into packed data words having a length equal to said segment length; and
   storing means for storing said packed data words into respective segments in said memory, said packing means comprising:
   a first register coupled to said coding means for storing said coded data, and
   a second register coupled to said memory capable of storing data having word lengths equal to said segment length, said first and second registers being connected in series to form a loop register, whereby said coded data temporarily stored in said first register is sequentially shifted to said second register until said second register is filled with more than one coded data word to form packed data, and the packed data stored in said second register is shifted to one segment in said memory.

3. A voice recording and reproducing apparatus as claimed in claim 1, wherein said storing means comprises means for producing address data representing an address of a segment in said memory.

4. A voice recording and reproducing apparatus as claimed in claim 3, wherein said storing means further comprises address data increment means for incrementing the address data after each storing of said packed data in a segment designated by said address data.

5. A voice recording and reproducing apparatus as claimed in claim 1, further comprising:
   reading means for reading a packed data word in a segment;
   unpacking means for unpacking said packed data into separate individual coded data words; and
   decoding means for decoding said coded data into synthesized voice waveforms.

6. The voice recording and reproducing apparatus according to claim 1, wherein said packing means comprises transfer means for transferring data stored in one portion of said memory, a source portion, to another portion of said memory, an object portion, said transfer means comprising means for shifting packed data words from said source portion to said object portion without unpacking said packed data words.

7. The voice recording and reproducing apparatus according to claim 6, wherein said apparatus further comprises erasing means for erasing a predetermined portion of data from said memory, and wherein said transfer means comprises:
   at least three storage locations,
   initializing means for initializing each of said three storage locations by storing a data word representative of a first segment address of said source portion in a first of said three storage locations, storing a data word representative of a first segment address of said object portion in a second of said three storage locations, and storing a data word representative of a last segment address of said source portion in a third of said three storage locations,
   a buffer for providing temporary storage for words from segments in said source and object portions;
   incrementing means for incrementing the address data words stored in said first and second storage locations, and
   comparing means for comparing address data stored in said first storage locations with address data stored in said second storage location.

8. A waveform encoding and decoding apparatus comprising:
   a memory having a plurality of segments for storing data, each segment having a length of a predetermined number of bits;
   coding means for encoding an analog waveform into digital coded data words each having a predetermined length;
   packing means for packing more than one of said coded data words into packed data words having a length equal to the segment length, said packing means including a loop register for receiving and packing said coded data words; and
   storing means for storing said packed data words into respective segments in said memory.

9. The waveform encoding and decoding apparatus according to claim 8, wherein said packing means comprises transfer means for transferring data stored in one portion of said memory, a source portion, to another portion of said memory, an object portion, said transfer means comprising means for shifting packed data words from said source portion to said object portion without unpacking said packed data words.

10. A waveform encoding and decoding apparatus comprising:
    a memory having a plurality of segments for storing data, each segment having a length of a predetermined number of bits;
    coding means for encoding an analog waveform into digital coded data words each having a predetermined length;

packing means for packing more than one of said coded data words into packed data words having a length equal to the segment length, said packing means having a first register for receiving in parallel fashion said coded data words, said first register having a length equal to said predetermined number of bits, and a second register coupled to said first register in series; and storing means for storing said packed data words into respective segments in said memory.

* * * * *